(12) United States Patent
Hicks et al.

(10) Patent No.: US 11,672,092 B2
(45) Date of Patent: Jun. 6, 2023

(54) MODULAR ELECTRICAL DISTRIBUTION SYSTEM FOR VEHICLES

(71) Applicant: Steiner Enterprises, Lafayette, IN (US)

(72) Inventors: Thomas P. Hicks, Lafayette, IN (US); Donald E. DeWitt, Syracuse, IN (US); Joshua E. DeWitt, Westfield, IN (US); Jonathan Brock, Warsaw, IN (US); Brad Giggy, LaGrange, IN (US)

(73) Assignee: Steiner Enterprises, Lafayette, IN (US)

( * ) Notice: Subject to any disclaimer, the term of this patent is extended or adjusted under 35 U.S.C. 154(b) by 399 days.

(21) Appl. No.: 17/091,459

(22) Filed: Nov. 6, 2020

(65) Prior Publication Data
US 2021/0136940 A1 May 6, 2021

Related U.S. Application Data

(60) Provisional application No. 62/931,249, filed on Nov. 6, 2019.

(51) Int. Cl.
*H05K 5/00* (2006.01)
*H05K 5/02* (2006.01)
*B60R 16/023* (2006.01)
*H02G 5/06* (2006.01)

(52) U.S. Cl.
CPC ....... *H05K 5/0247* (2013.01); *B60R 16/0238* (2013.01); *H02G 5/06* (2013.01)

(58) Field of Classification Search
CPC ..... H05K 5/0247; B60R 16/0238; H02G 5/06
See application file for complete search history.

(56) References Cited

U.S. PATENT DOCUMENTS

2020/0088777 A1* 3/2020 Marshall .............. G01R 1/0416
2020/0161799 A1* 5/2020 Oda ..................... B60R 16/0238
2020/0381905 A1* 12/2020 Sasaki ................ H05K 5/0213

* cited by examiner

*Primary Examiner* — Pete T Lee
(74) *Attorney, Agent, or Firm* — Maginot, Moore & Beck LLP (57) ABSTRACT

A modular electrical distribution system for an RV comprises a water-tight housing for mounting to the RV with a plurality of water-tight openings for receiving electrical cables or wires from a towing vehicle and/or auxiliary electrical devices. The system includes a power-in assembly, a trailer connection assembly and a breaker assembly that can be tailored to the particular electrical distribution needs of the RV. The trailer connection assembly includes a plurality of electrical terminals for engagement to wires connected to electrical components of the towing vehicle, such as brake lights, turn signal lights, etc. The breaker assembly includes a plurality of circuit breakers or fuses connected to the power-in assembly and to a plurality of corresponding output bars with output terminals to connect to the cables/wires for the auxiliary electrical devices. The system can include an auxiliary circuit for connection to an auxiliary power source, such as a solar panel array.

14 Claims, 8 Drawing Sheets

FIG. 14A Base Configuration with Disconnect

FIG. 14B Mounting screws and nuts removed.

FIG. 14C Step 1: Slide breakers up.

FIG. 14D Step 2: Slide breakers away from each other.

FIG. 14E Step 3: Slide right breaker down away from disconnect.

FIG. 14F Breakers Removed

MODULAR ELECTRICAL DISTRIBUTION SYSTEM FOR VEHICLES

REFERENCE TO RELATED APPLICATION AND PRIORITY CLAIM

This application is a utility filing from and claims priority to U.S. Provisional Application No. 62/931,249, filed on Nov. 6, 2019, the entire disclosure of which is incorporated herein by reference.

BACKGROUND

Recreational vehicles (RV) have evolved to incorporate many electrical components that can be powered by the RV electrical power system (i.e., the RV battery), as well as the ability to tow adjunct vehicles with parallel lighting arrangements that are also powered by the RV electrical power system. As a consequence, electrical signal and power distribution systems for RVs have become increasingly complex. At present wiring harnesses are used to connect the RV to the various electrical components and to connect the RV to the lighting arrangement of the towed vehicle. The wiring harnesses are frequently a jumbled array of wires, electrical connectors and fuses that are beyond the technical ability of many RVers to use. Moreover, many electrical connections incorporate ganged terminals that are exposed to the elements and often randomly organized. Disconnecting power from the RV electrical system can be complicated by the location of the disconnect switch, which is usually separate from the distribution harness. This leads to the need for long runs of heavy gauge electrical wire, not to mention the inconvenience of locating the switch, especially for the larger RVs.

In addition, the electrical distribution capabilities and electrical options can vary greatly between RVs, from the bare bones capability requiring very few electrical connections to the more elaborate systems requiring many electrical taps. Cost considerations often dictate the ease of use of the electrical distribution for the RV.

There is a need for a universal electrical distribution system that can be readily tailored to all RVs and all electrical system needs.

SUMMARY OF THE DISCLOSURE

A modular electrical distribution system for a primary vehicle, such as an RV, comprises a water-tight housing for mounting to the primary vehicle with a plurality of water-tight openings for receiving electrical cables or wires from a vehicle/trailer being towed and/or auxiliary electrical devices separate from the primary vehicle. The system includes a power-in assembly, a trailer connection assembly and a breaker assembly that can be tailored to the particular electrical distribution needs of the primary vehicle. The trailer connection assembly includes a trailer bar that is removably mountable within the housing and includes a terminal for connection to the primary vehicle battery and a plurality of electrical terminals for engagement to wires connected to electrical components of a secondary vehicle or trailer being towed by said primary vehicle. An indicator panel is adjacent the trailer bar with color-coded indicia corresponding to the color of the wires of the towed trailer/vehicle.

In one feature, the housing defines a plurality of mounting locations between the bus bar terminal and an output bar array for receiving circuit breakers or fuses. Output bars are provided for each of the circuit breakers for engagement to wires connected to auxiliary electrical components independent of the primary vehicle. A bus bar is electrically connected to the bus bar terminal, and a breaker bar arrangement is connected between the bus bar and the first terminal of each circuit breaker mounted within the housing. The second terminal of each of the circuit breakers is electrically connected to a corresponding one of the output bars. In one embodiment, two circuit breakers and two associated double terminal output bars are fixed within the housing, and mounting locations and single terminal output bars are available for two additional circuit breakers.

In another feature, the breaker assembly includes a disconnect switch assembly associated with the bus bar, that includes a switch operable in a first position to electrically disconnect the bus bar terminal from the first terminal of the mounted circuit breakers and a second position to electrically connect the bus bar terminal to the first terminal of mounted circuit breakers. A knob connected to the switch is supported on and removable with the cover of the housing to provide access to the enclosure of the housing. The knob and switch have a keyed connection so that the switch must be in the electrical disconnect position before the cover can be removed.

In a further feature, a separate circuit is provided for connection to an auxiliary power source, such as a solar panel array. The separate circuit can include its own circuit breaker/fuse. The separate circuit allows electricity generated by the auxiliary power source to be used to power accessories connected to the primary circuit, or to be used to recharge the vehicle batteries connected to the primary circuit.

DETAILED DESCRIPTION

Figure 7:
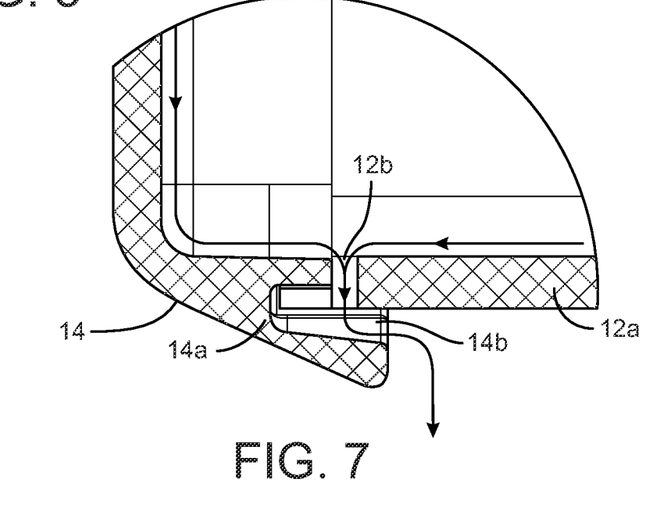
FIG. 7 is an enlarged cross-sectional view of a portion of the electrical distribution system shown in FIG. 6.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles disclosed herein as would normally occur to one skilled in the art to which this disclosure pertains A configurable modular electrical distribution system 10 for a recreational vehicle includes a weatherproof housing 12 and a weatherproof cover 14 defining an enclosure 15 for containing electrical components, as shown in FIGS. 1-13. The cover 14 can be provided with a seal ring 14*d* or similar structure to form a water-tight seal with the housing. The housing 12 includes a mounting feature, such as mounting flanges 16, for mounting the system 10 at a convenient location on the vehicle. Since the housing and cover are generally weatherproof, the system 10 can be mounted to an external surface of the RV to facilitate access to connect to the primary vehicle towing the RV and/or to connect to auxiliary devices. The housing can include a plurality of drain holes 12*b* defined in the side walls 12*a* of the housing, as shown in FIG. 7. The cover 14 can include a rim 14*a* that overlaps the top edge or perimeter of the side wall 12*a*, with the rim defining a drain channel 14*b* aligned with each of the drain holes 12*b*. The rim prevents rain from entering the drain holes into the enclosure 15. Four such drain features can be provided around the perimeter of the cover, as shown in FIG. 13, although other numbers of drain holes are contemplated. The cover 14 can be removably fastened to the side walls 12 of the housing in a conventional manner, such as by screws threaded into bosses formed on the side walls.

The housing defines a plurality of openings 17-21 to receive electrical wiring as described herein, with each opening provided with a rubber grommet, cord seal or other sealing feature 23 (FIG. 3) known in the art to establish a weather-resistant seal. An opening 22 can be provided in the bottom wall 12*c* of the housing that can directly communicate with a corresponding opening in the surface of the vehicle on which the system 10 is mounted. The opening 22 can be in the form of a press-out disc defined in the bottom wall, or can include a cap (not shown) that can be removed as needed.

In one feature of the present disclosure, the distribution system 10 is a modular construct that allows selection of the electrical components incorporated into the system based on the needs of the vehicle on which the system is mounted. The modular system thus includes three modular components—a power-in assembly 25, a trailer connection assembly 26 and a breaker assembly 27. The trailer connection assembly 26 provides electrical connection points for connecting a towed RV to the towing vehicle. The trailer connection assembly is connected to the vehicle battery of the towing vehicle. As discussed below, the trailer connection assembly is optional and may be eliminated if the RV is a stand-alone vehicle. The breaker assembly provides electrical connection points for electrical devices and accessories associated with the RV to be powered by the auxiliary power system of the primary vehicle, such as an RV battery array. As shown in FIGS. 8-12, various elements of these three modular components can be eliminated or modified depending on the need of the primary vehicle on which the system is mounted.

Figure 8:
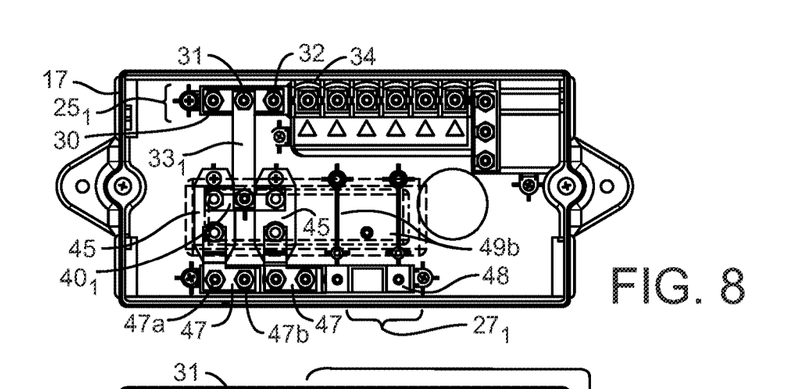
FIGS. 8-12 are top views of the electrical distribution system shown in FIG. 1 with the cover removed showing different configurations of the modular system

Looking first at the power-in assembly, the basic assembly $25_1$, as shown in FIG. 8, includes an input terminal 30, fixed within the housing, which is aligned with the wire opening 17 for connection to a positive terminal of the RV battery. In other words, a power cable P, which originates from the RV battery passes through the opening 17 and is electrically connected to the input terminal 30 (FIG. 15*c*) to provide electrical power to the breaker assembly 27, regardless of the configuration of the assembly. The input terminal 30 and the electrical connection between the vehicle power cable and that terminal can be of any configuration known in the art. As shown in FIG. 8, the input terminal is electrically connected to a bus bar terminal 31, fixed within the housing, to which a bus bar $33_1$ is connected. The input terminal 30 is also electrically connected to a terminal 32, fixed within the housing, which can be a dedicated binding post for a break-away switch. As shown in the basic version of FIG. 8, the bus bar $33_1$ is electrically connected to a removable breaker bar 401 of the breaker assembly 27 which provides electrical connection of the vehicle power supply to one or more circuit breakers or fuses 45 (FIG. 4) by way of respective first terminals 45*a*, 45*b* on the circuit breakers. In the base configuration shown in FIG. 8, the breaker assembly $27_1$ includes two circuit breakers 45 connected between the breaker bar 401 and a corresponding output bar 47 by respective second terminals 45*c*, 45*d*. It can be appreciated that the circuit breakers can be circuit breakers or fuses appropriate for vehicle electrical systems.

The output bars 47 can be fixed to mounting pads 48 on the bottom wall 12*c* of the housing. Two of the output bars 47 include corresponding double output terminals 47*a*, 47*b* that can be electrically connected to auxiliary electrical components independent of the vehicle and its electrical components, by wiring passing through the opening 20 and/or opening 21. Two additional output bars with corresponding single output terminals 47*c* can be associated with additional circuit breakers or fuses, as described below.

Figure 9:
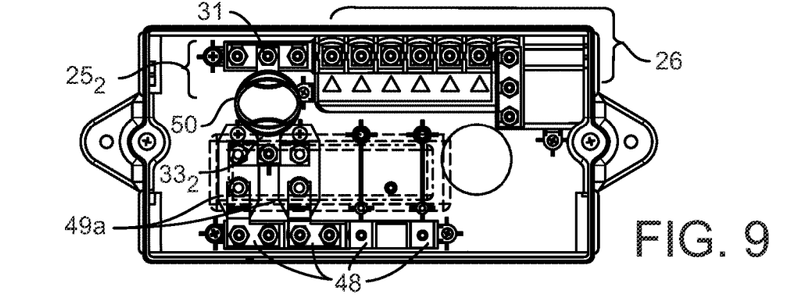
Figure 10:
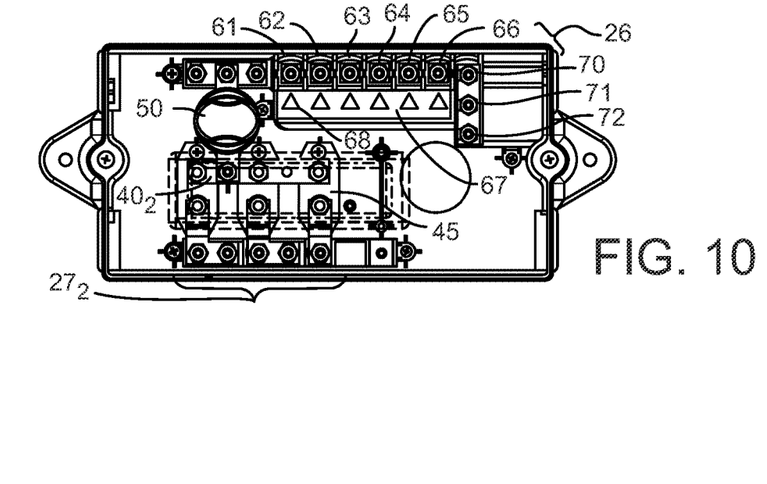

The breaker assembly 27 includes mounting locations 49*a* (FIG. 9) for the two breakers 45 shown in base configuration of FIG. 8, as well as mounting locations 49*b* (FIG. 8) for two additional circuit breakers. The mounting locations can include threaded bores or posts to engage corresponding threaded mating components associated with the breakers, or can include clips or clamps known in the art for fixing electrical components to the housing. The two breakers 45 may be fixed and not removable, or can be removable from the mounting locations 49*a*. As shown in FIG. 10 one additional breaker 45 can be added to one of the mounting locations 49*b* for the breaker assembly 272. The breaker bar 402 is longer than the breaker bar 401 of the base configuration in order to provide electrical connection to the additional circuit breaker. Similarly, in the configuration shown in FIG. 11, a fourth circuit breaker 45 is added to the last available mounting location 49 for the breaker assembly 273. A commensurately longer breaker bar 403 is then provided to electrically connect all four breakers 45 to the bus bar 33*i*. In an alternative approach, a modular breaker bar, such as the breaker bar 401, can be mounted one on top of the other to extend the electrical connection to the additional breakers. Thus, for the three-circuit breaker embodiment of FIG. 10, a first breaker bar 401 is connected to the left most breakers and a second breaker bar 401 is mounted on top of the right end of the first breaker bar in daisy-chain fashion to connect to the additional circuit breaker to the right. Similarly, three breaker bars 401 can be daisy-chained for the embodiment of FIG. 11 to connect the third and fourth circuit breakers.

Returning to FIG. 8, the base configuration provides a basic electrical distribution unit for accessories separate from the primary vehicle, with a direct connection to the primary vehicle battery. The power-in assembly further includes a terminal 32 arranged for electrical connection to a trailer bus bar 34 that provides electrical connection of the trailer connection assembly 26 to the primary vehicle power input. The terminal 32 can be in the form of a break-away switch known in the art.

Figure 11:
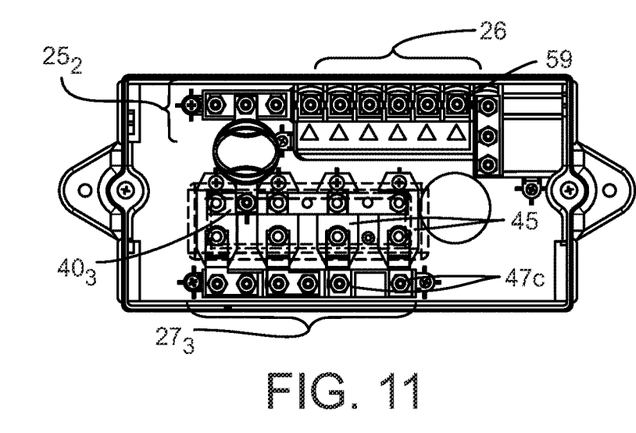
Figure 12:
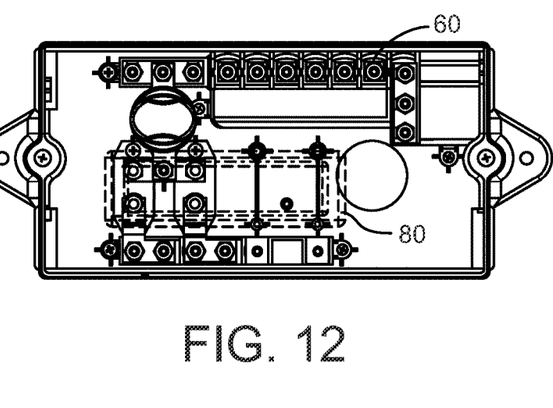
Figure 13:
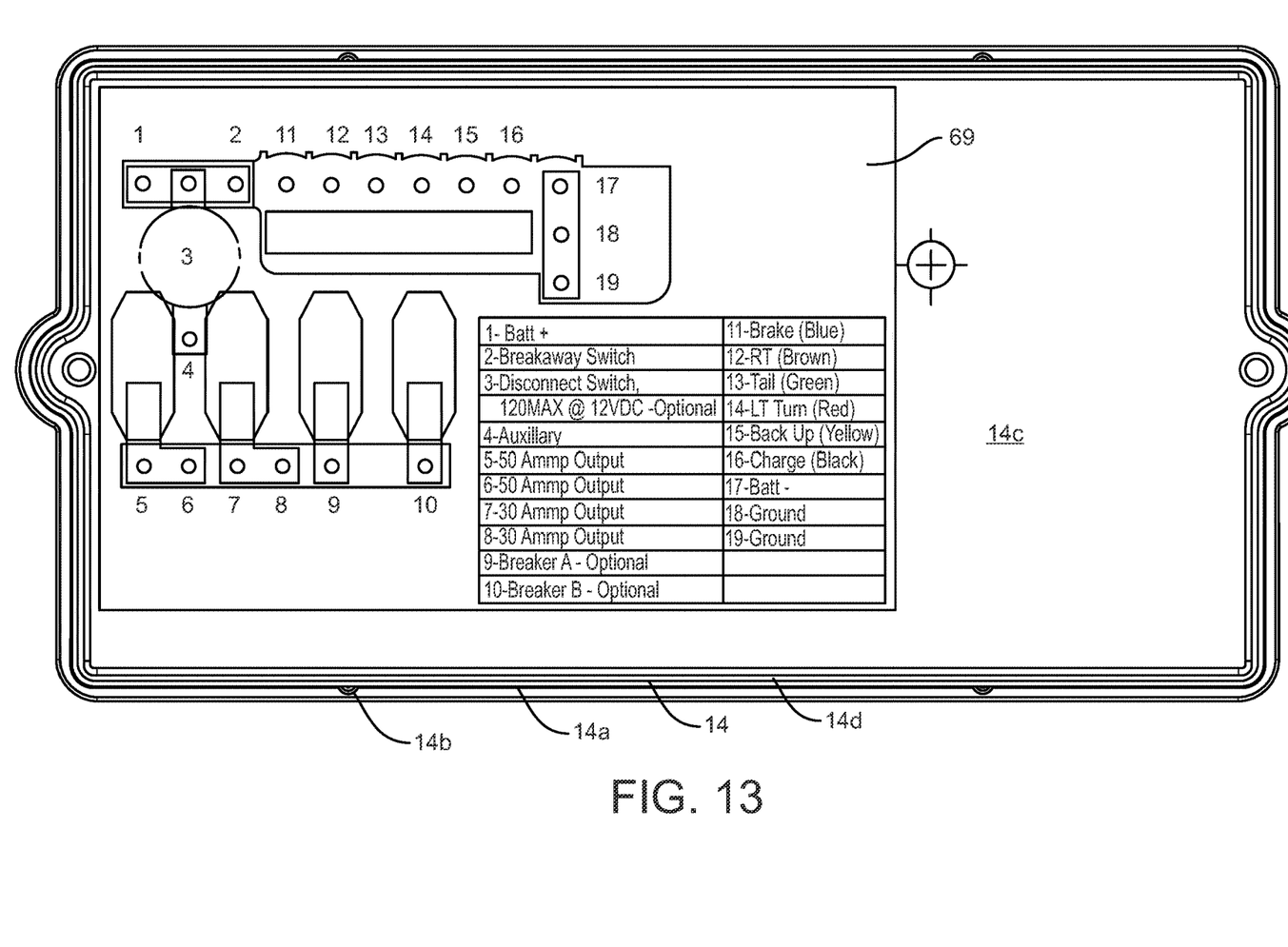
FIG. 13 is bottom view of the cover of the electrical distribution system shown in FIG. 1.
Figures 15A, 15B:
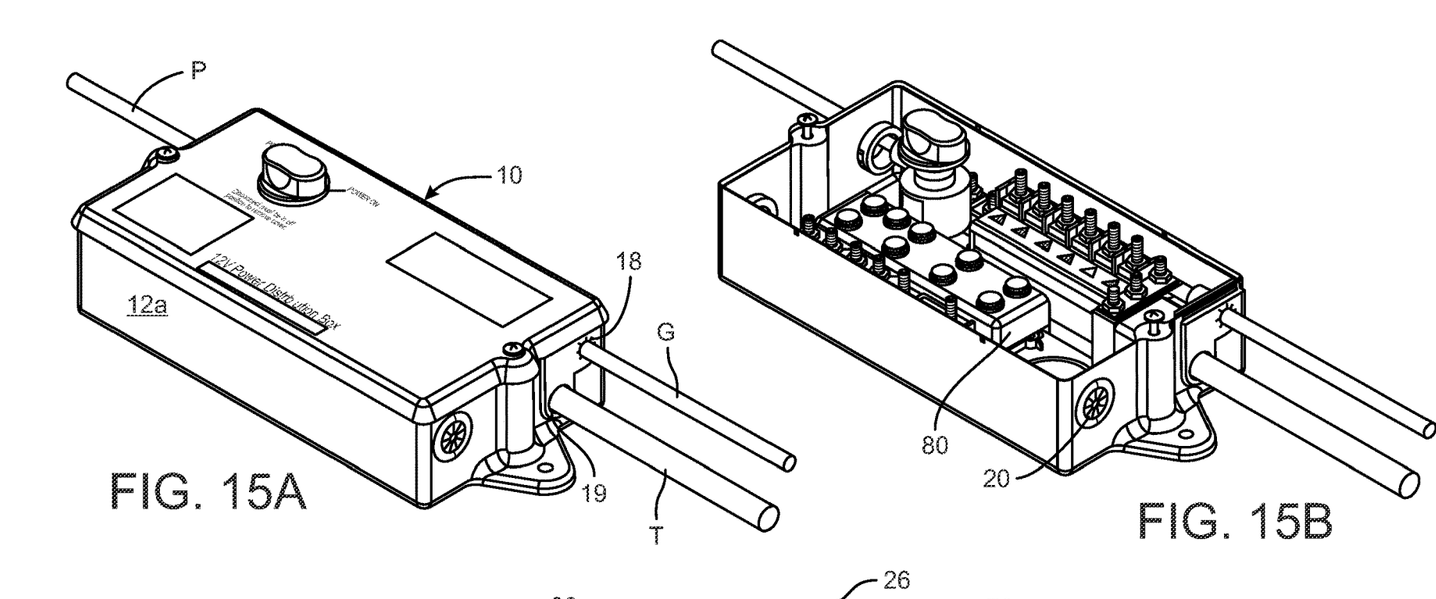
FIGS. 15*a*-15*c* are perspective and top views of the electrical distribution system shown in FIG. 1 shown with external cables connected to the system.
Figure 15C:
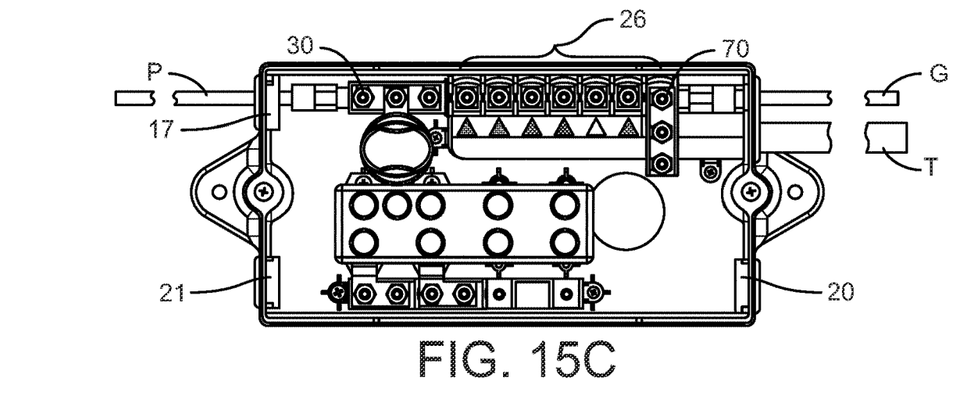

The housing 12 includes a mounting location 60 (FIG. 12) on which the trailer connection assembly 26 can be optionally mounted when the RV is being towed, as shown in the configurations shown in FIGS. 8-11, or eliminated as shown in FIG. 12, when the RV is a stand-alone vehicle. The assembly 26 can be mounted to the housing at the mounting location 60 in a conventional manner, such as with screws, clips or clamps as known in the art. As shown in FIG. 10, the trailer connection assembly 26 includes a trailer bar 59 that includes electrical connection terminals corresponding to a plurality of electrical components of the towed trailer or secondary vehicle. Thus, the assembly can include an electrical terminal or post 61 for connection to wiring connected to the RV brake lights, terminals 62 and 64 for the right and left turn signals, respectively, a terminal 63 for the RV tail lights, a terminal 65 for back-up lights, and a terminal 66 for a charge configuration. The trailer connection assembly 26 includes an indicator panel 67 with color-coded indicia, such as colored triangles 68, aligned with each of the terminals 61-66. The triangles are color-coded to correspond to the color of the individual wires included in trailer connection wire T (FIG. 15c)—i.e., blue, brown, green, red, yellow and black in sequence from left to right in FIG. 10. It is understood that the trailer connection wire T is adapted to mate with a trailer electrical connection on the towing vehicle, as is known in the art. The sequence of wire connections can also be depicted on a schematic label 69 on the underside 14c of the cover 14, as shown in FIG. 13. The indicator panel 67 provides a clear visual indication to the user how to properly connect the terminals of the trailer connection assembly 26 to the appropriate lights of the RV. The sequence of the terminals and associated wire colors can be arbitrary. The assembly 26 further includes terminals 70-72 that are fixed within the housing. The terminal 70 can be connected to the negative terminal of the RV battery by cable G (FIG. 15c). The terminals 71, 72 can be connected to ground posts of the RV.

It can be noted that schematic label 69 in the cover also identifies the breaker output terminals 47a, 47b, 47c associated with the two primary breakers at mounting locations 49a and any additional breakers in mounting locations 49b. In one embodiment, the two sets of terminals 47a, 47b can correspond to a predetermined amperage output—50 amps in the example—while the auxiliary output terminals 47c can correspond to a different predetermined amperage—30 amps in the example.

Figure 1:
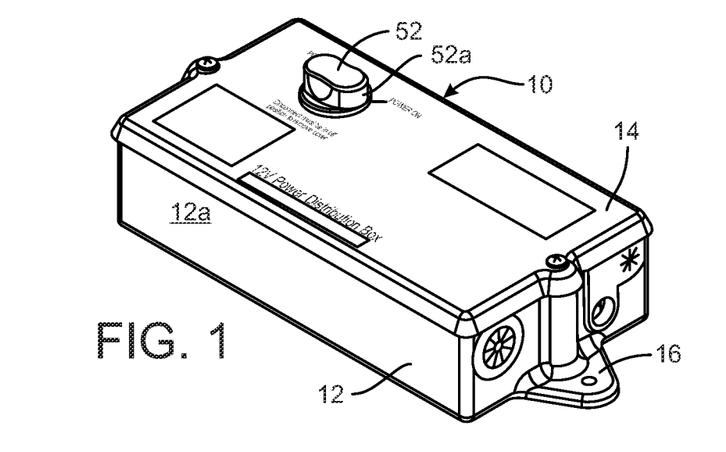
FIG. 1 is a perspective view of a modular electrical distribution system according to the present disclosure.
Figure 2:
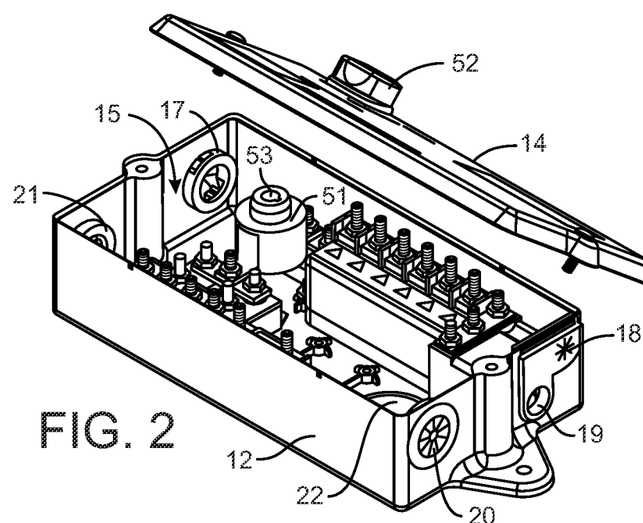
FIG. 2 is a perspective view of the electrical distribution system shown in FIG. 1 with the cover opened.
Figure 3:
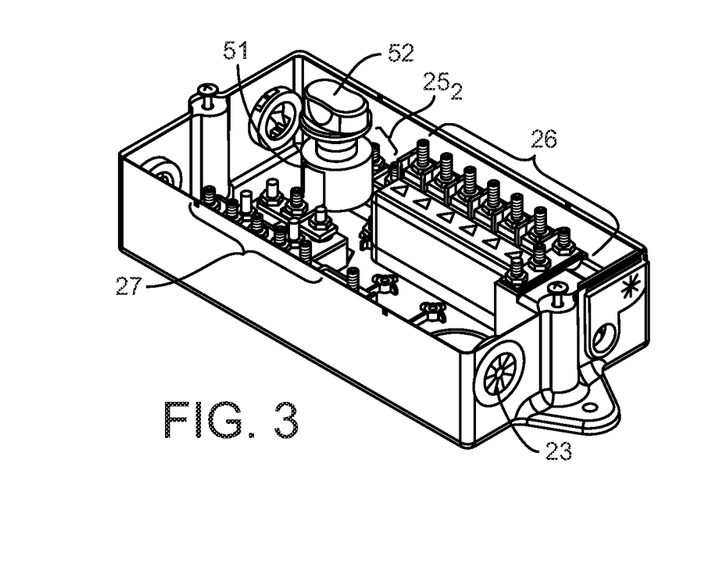
FIG. 3 is a perspective view of the electrical distribution system shown in FIG. 1 with the cover removed.
Figure 4:
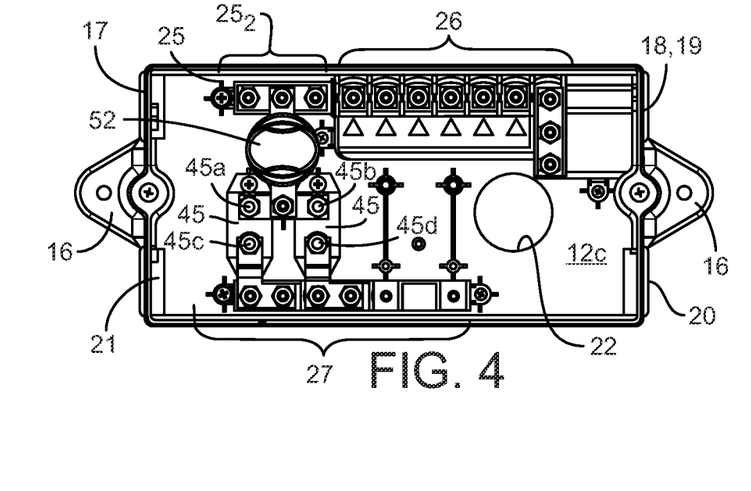
FIG. 4 is a top view of electrical distribution system shown in FIG. 1 with the cover removed.
Figure 5:
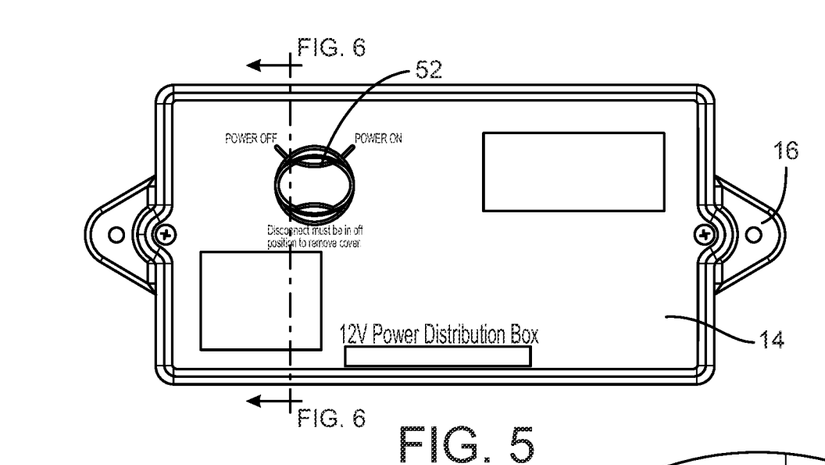
FIG. 5 is top view of the electrical distribution system shown in FIG. 1.
Figure 6:
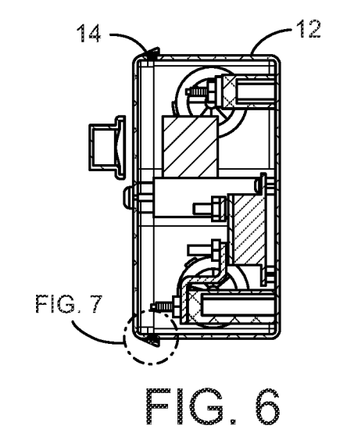
FIG. 6 is a side cross-sectional view of the electrical distribution system shown in FIG. 5.

In the base configuration shown in FIG. 8, the power-in assembly 25$_1$ is directly electrically connected to the breakers by the bus bar 33$_1$. In an alternate configuration shown in FIG. 9, a disconnect switch assembly 50 is provided between the bus bar terminal 31 and the bus bar 33$_2$. As shown in more detail in FIGS. 2-3, the assembly includes a switch 51 that can be a two-position switch—power on and power off (FIG. 5)—to control electrical power to the breaker assembly. The switch 51 includes a post 53 that projects through an opening (not shown) in the cover 14 for engagement with a knob 52. The knob 52 is rotatably connected to the cover 14 at the opening and removable with the cover when the cover is removed for access to the internal components of the distribution system 10. The knob includes an interior bore (not shown) that is configured to slide over the post 53. The post 53 and bore in the knob 52 are keyed so that the knob cannot be removed from the post unless the knob, and therefore the switch 50, is in the power-off position. This feature ensures that electrical power is not supplied to the breakers 45, for instance, when it is desired to remove, add or replace a breaker. For additional protection, an insulator panel 80 may be disposed over the circuit breaker assembly 27$_{1-3}$ (FIGS. 12, 15b). In one embodiment, the switch assembly 50 includes the bus bar 33$_2$ integrated with the switch 51 so that the assembly is modular and readily mountable between the power-in assembly 25$_2$ and the breaker assembly 27. The cover 14 can include a "Power ON" and a "Power OFF" label to be aligned with an indicator 52a on the knob, as shown in FIG. 1.

Figure 14A:
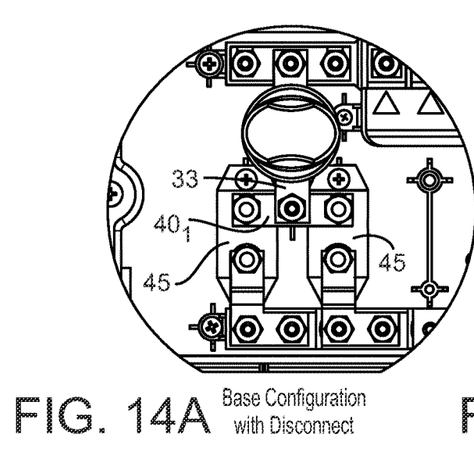
FIGS. 14*a*-14*f* are detail views of the steps for removing circuit breakers in the electrical distribution system shown in FIG. 1.
Figure 14B:
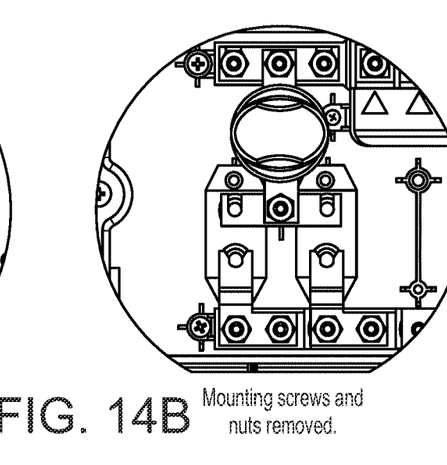
Figure 14C:
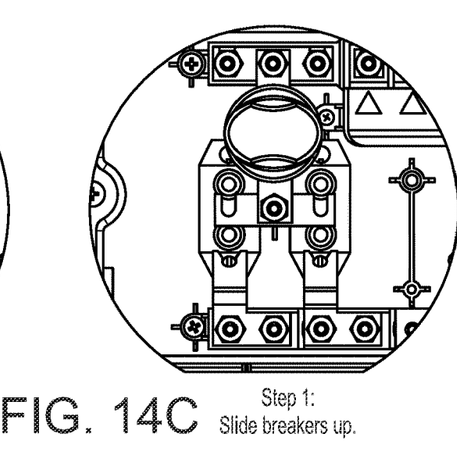
Figure 14D:
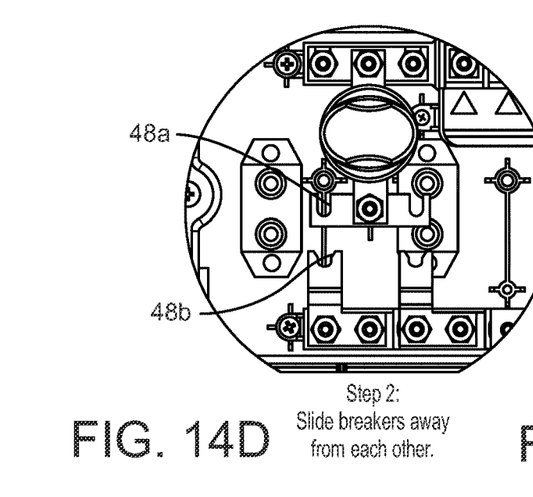
Figure 14E:
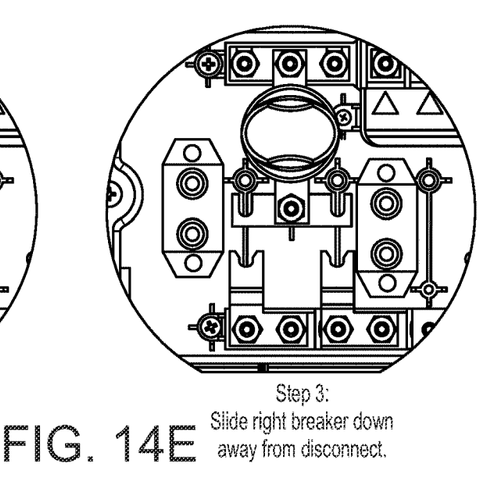
Figure 14F:
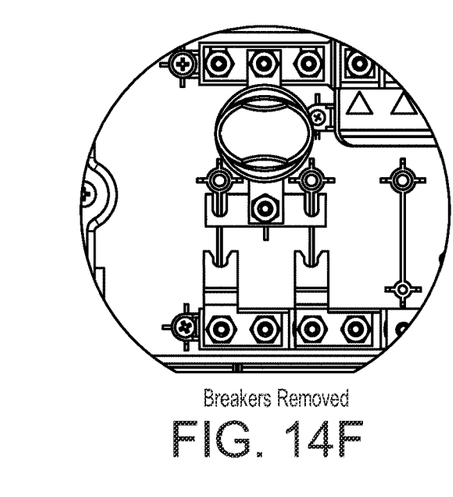

When the cover 14 is properly removed and power to the circuit breakers has been disconnected by the switch 50, the circuit breakers 45 can be removed in the manner shown in FIGS. 14a-f. The breakers 45 are shown connected to the bus bar 33 by the breaker bar 401 in FIG. 14a. In FIG. 14b, the screws mounting the breakers to the housing 12 are removed, along with the nuts that engage the breaker terminals 45a, 45b to the breaker bar 401 and output bar 47 are removed. The breakers are then disengaged from the breaker bar 401 and output bar 47 by sliding the breakers upward and laterally as shown in FIGS. 14c-14e. It can be seen that the breaker bar and output bar define U-shaped slots 48a, 48b, respectively, which allow the breakers to slide into and out of engagement with the bars. The breakers can then be removed, as shown in FIG. 14f. It is noted that in the illustrated embodiment the breakers are mounted by screws, but other mounting methods are contemplated, such as snap-in or in-line connections and other mounting techniques known in the art.

The distribution system 10 of the present disclosure is a modular system that allows the electrical connection features to be tailored to the particular needs of the primary vehicle on which the system is mounted. In the base configuration shown in FIG. 8, a direct electrical connection is provided to two circuit breakers in the breaker assembly 27$_1$ and to the terminals in the trailer connection assembly 26. In FIG. 9, the disconnect switch 50 is added to the base configuration. It is noted that in this configuration the switch knob 52 is mounted to the cover 14. The same cover can be used in the base configuration of FIG. 8 which does not include the switch. In this configuration the opening that would otherwise support the knob can be provided with a cover plate (not shown) that can be snapped into the opening (not shown) through which the knob extends. Configurations in which one and two additional circuit breakers 45 are added are shown in FIGS. 10-11. In FIG. 12, the base configuration is modified to remove the trailer connection assembly 26.

FIGS. 15a-15c show a distribution system 10 in the base configuration with wiring connections to accessories of the primary vehicle and to the towed trailer/vehicle. The primary vehicle power cable P extends through opening 17 for connection to the input terminal 30. The cable G connected to the RV battery negative passes through opening 18 for connection to the terminals 70. The trailer cable T extends through opening 19 for connection to the appropriate trailer connection terminals 61-66 of the trailer connection assembly 26. Wires for the separate auxiliary electrical devices can pass through either of the openings 20, 21 for connection to any of the terminals in the output bars 47.

The modular electrical distribution system 10 of the present disclosure can be provided as a kit to be mounted to the RV. The kit can include a trailer connection assembly 26 that provides a means to connect the RV lights to the towing vehicle, and the output bar 47, both fixed within the housing 12. The kit can further include up to four circuit breakers/fuses 45, 49 and a bus bar $33_1$ and a disconnect switch assembly 50 having a bus bar $33_2$. If the RV is s stand-alone vehicle the user can choose not to incorporate the trailer connection assembly 26. The vehicle user can choose to omit both of the bus bar $33_1$ and the switch assembly 50 if there are no auxiliary electrical devices/components to be connected to the output bar. On the other hand, if there are auxiliary electrical components, the vehicle user can select either of the bus bar $33_1$ or the switch assembly 50 to connect the output bar to the power input terminal 25.

Figure 16:
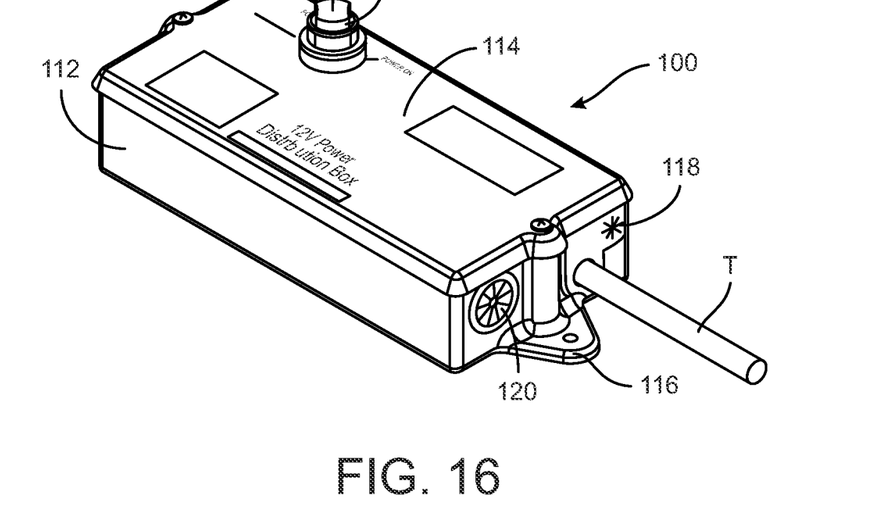
FIG. 16 is a perspective view of an electrical distribution system according to a further embodiment of the present disclosure.
Figure 17:
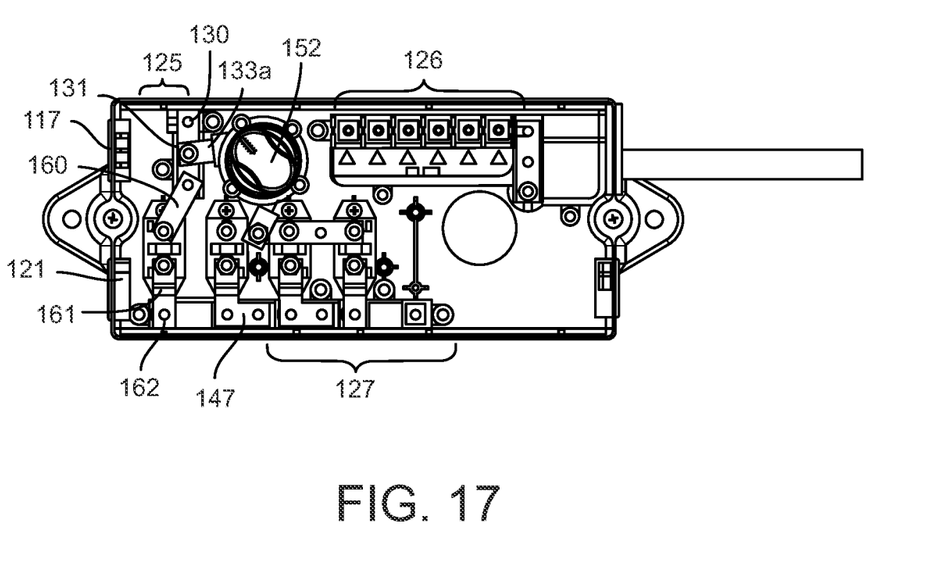
FIG. 17 is a top view of the electrical distribution system shown in FIG. 16, with the cover removed.
Figure 18:
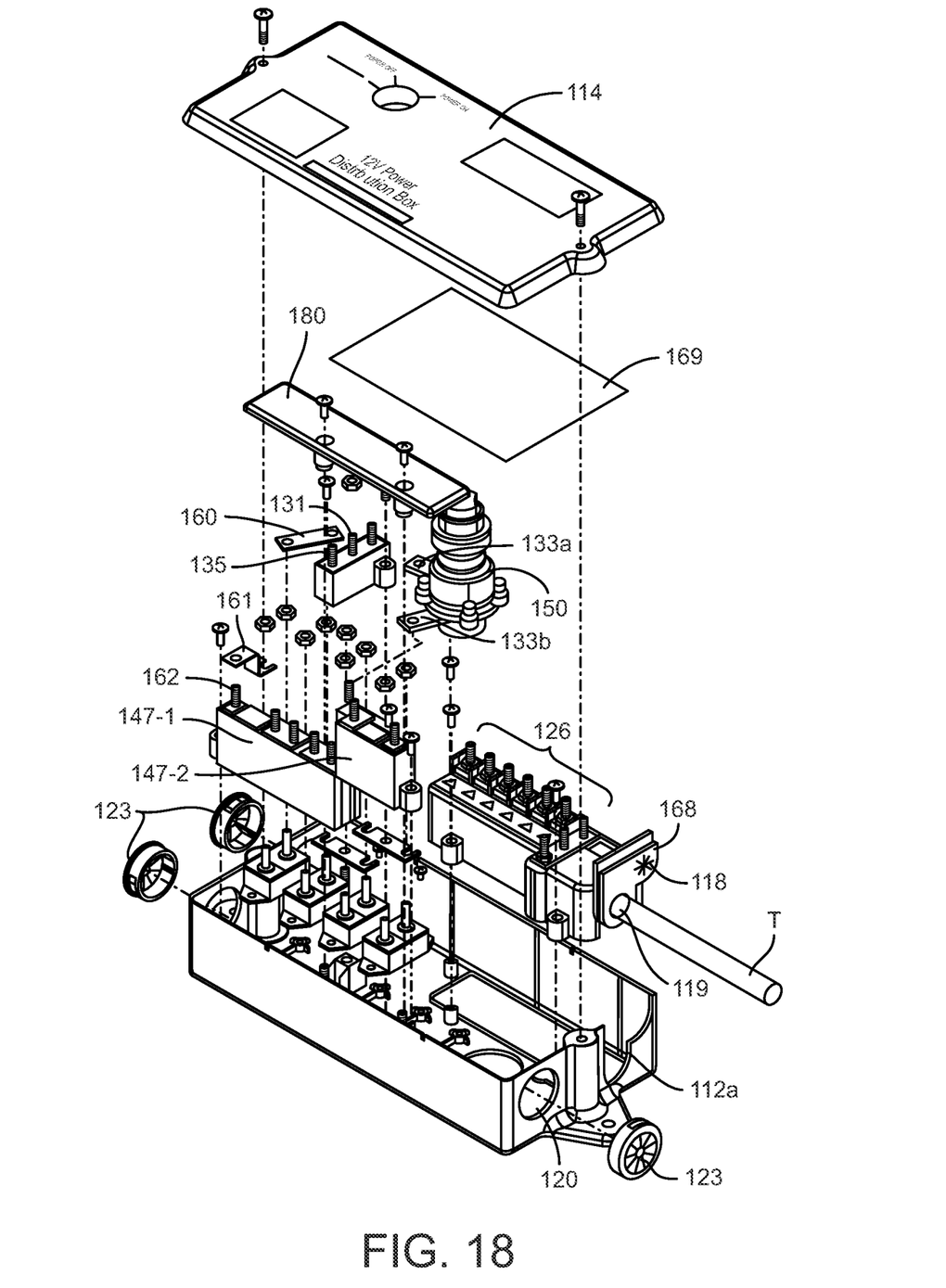
FIG. 18 is an exploded view of the electrical distribution system shown in FIG. 16.

In another embodiment of this disclosure, a modular electrical distribution system 100, shown in FIGS. 16-18, accommodates an auxiliary power source separate from the vehicle itself. In particular, many RV owners power auxiliary equipment and accessories with an auxiliary power source, such as a solar power array. The auxiliary power source can also be used to charge the primary vehicle battery and any secondary batteries carried by the RV. The system 100 is similar in construction to the system 10 described above. (The first two digits of the feature numbers for the system 100 correspond to the like numbered components of the system 10). Thus, the system includes a housing 112 with a removable cover 114 that carries the knob 152 associated with a disconnect switch assembly 150. The cover includes the label 169 that provides a map identifying the location of the components of the system, like the label 69. The housing includes the mounting flanges 116, openings 117-121 to receive wiring and cables, and sealing features such as grommets 123 at the openings. It is noted that the openings 118, 119 are incorporated into a removable cover plate 168 that is received within a corresponding opening 112a in the housing 112. The cover plate 168 can be part of and removable with the trailer connection assembly 126. The cover plate 168 can be integrated with the trailer cable T for connection to the towing vehicle. The assembly 126 can include the terminals 61-66 (see FIG. 10) if the RV is towed, or the terminals can be eliminated if the RV is a stand-alone vehicle. This same construction can be incorporated into the system 10.

Like the system 10, the system 100 includes a power-in assembly 125, a removable trailer connection assembly 126 and a breaker assembly 127 with associated output bars 147. The output bars are carried on blocks $147_1$, $147_2$ (FIG. 18) that can be removably mounted within the housing. (It is noted that a similar construction can be implemented in the system 10). The block $147_1$ is configured to be connected to the two primary circuit breakers or fuses 45 in the basic configuration shown in FIGS. 8-9. The block $147_2$ is configured to be connected to the additional or expansion circuit breakers shown in FIGS. 10-11. However, in a modification from the system 10, the block $147_1$ includes an additional output terminal 162 that can be electrically connected to wiring from the auxiliary power source or solar panel array. The output terminal 162 is connected to a separate circuit breaker/fuse for the auxiliary power source by an output bar 161, and the circuit breaker/fuse is connected to an auxiliary power bus bar 160. The bus bar 160 is connected to an auxiliary bus bar terminal 135 that is included in the power-in assembly 125 with the input terminal 130 and bus bar terminal 131. The system 100 includes an insulator panel 180 that spans the length of both blocks $147_1$, $147_2$.

The bus bar terminal 131 is connected to the primary circuit breakers in the basic configuration or in the modified configuration that includes the disconnect switch assembly 150. As shown in FIG. 17, the switch assembly 150 is re-oriented within the housing from the position shown in FIG. 4 for the first system 10. The switch assembly is connected to the bus bar terminal 131 by the bus bar segment 133a and is connected to the output array 127 by the bus bar segment 133b. The switch assembly 150 operates just like the assembly 50 to control electrical power to the circuit breaker assembly 127 and to the components and accessories connected to the output bars 147.

It can be appreciated that the auxiliary bus bar terminal 135, the bus bar 160, the output bar 161, and the output terminal 162 provide an electrical path separate from the electrical path for the basic configuration through the bus bar terminal 131 and switch 150. In particular, this additional electrical path directs current in the opposite direction to the primary electrical path. In other words, in the primary path, the current passes from the RV power supply to the system 100, and through the circuit breakers 45, 145 to the various output terminals for providing power to accessories for the RV. On the other hand, in the auxiliary path, current passes from the auxiliary power supply, such as a solar panel array, to the output terminal 162, through a dedicated circuit breaker/fuse, to the auxiliary bus bar terminal 135. The RV battery can be connected to the input terminal 130 to be electrically connected to the auxiliary bus bar terminal 135 to receive electricity generated by the auxiliary power source. Since the auxiliary bus bar terminal 135 is part of the power-in assembly 125 it is electrically connected to the bus bar terminal 131 so that electrical power generated by the auxiliary power source can be fed directly to the primary circuit breakers and output bars 147 to thereby provide power directly to the RV accessories. In this configuration, the RV power supply is not connected to the system 100.

It can be appreciated that both electrical distribution systems 10, 100 are modular so that the user can decide how the system is configured by adding or removing components. The systems can thus be configured with any combination of trailer connection assembly 26/126 and breaker assembly 27/127, with two, three or four breakers 45, and auxiliary (solar) power. The system can be provided with all of the components to allow the user to choose among the components at any time. The modular feature of the systems 10, 100 allow the components to be easily mounted within the housing with mechanical screws. The cover 14/114 and disconnect switch assembly 50/150 ensures the user's safety by disconnecting electrical power to the breaker assembly and output terminals before the cover can be removed.

The present disclosure should be considered as illustrative and not restrictive in character. It is understood that only certain embodiments have been presented and that all changes, modifications and further applications that come within the spirit of the disclosure are desired to be protected.

What is claimed is:

1. A modular electrical distribution system for a recreational vehicle (RV), in which the RV is towed by a towing vehicle or is a stand-alone vehicle, the system comprising:
a water-tight housing including a mounting feature for mounting the housing to the RV, said housing including a plurality of water-tight openings for receiving electrical cables or wires, the housing defining an enclosure;

a power-in assembly disposed within said enclosure, said power-in assembly including;

an input terminal fixed within said enclosure configured to be electrically connected to a power cable connected to the positive terminal of a battery of the RV, the power cable passing through one of said plurality of water-tight openings to connect the power-in assembly to the battery of the RV; and a bus bar terminal fixed within said enclosure and electrically connected to said input terminal; and a trailer connection assembly removably mountable within said enclosure and including a trailer bar a plurality of electrical terminals for engagement to wires passing through one of said plurality of water-tight openings and connected to electrical components of the towing vehicle.

2. The modular electrical distribution system of claim 1, wherein:

said housing defines a plurality of mounting locations between said bus bar terminal and said output bar for receiving a corresponding circuit breaker or fuse; and said system includes;

one or more output bars disposed within said enclosure, each including a number of output terminals for engagement to wires connected to electrical components independent of the primary vehicle, said one or more output bars optionally electrically connectable to said bus bar terminal; and a breaker assembly including;

one or more circuit breakers or fuses mountable at a corresponding one of said plurality of mounting locations, each having a first terminal and a second terminal; and a bus bar electrically connected to said bus bar terminal; and a breaker bar arrangement connected to said bus bar and to the first terminal of the one or more circuit breakers, wherein said second terminal of each of said one or more circuit breakers is electrically connected to a corresponding one of said one or more output bars.

3. The modular electrical distribution system of claim 2, wherein:

said one or more circuit breakers includes:

two fixed circuit breakers fixed within a corresponding one of said plurality of mounting locations in said housing;

two of the one or more output bars being fixed within the housing and connected to the second terminal of each of the two fixed circuit breakers;

one or more additional circuit breakers optionally mountable within a corresponding one of said plurality of mounting locations in said housing and connectable to said bus bar and to a corresponding one of said one or more output bars; and one or more additional output bars connectable to the second terminal of the one or more additional circuit breakers; and said breaker bar arrangement includes;

one breaker bar connected to the bus bar and between the first terminal of the two fixed circuit breakers; and at least one additional breaker bar connectable to the first terminal of the one or more additional circuit breakers and to the first terminal of an adjacent one of the fixed or additional circuit breakers.

4. The modular electrical distribution system of claim 2, wherein said breaker assembly includes a disconnect switch assembly associated with said bus bar, said disconnect switch assembly removably connectable to said bus bar terminal and including:

a switch operable in a first position to electrically disconnect the bus bar terminal from said first terminal of the one or more circuit breakers and a second position to electrically connect the bus bar terminal to said first terminal of the one or more circuit breakers; and a knob connected to said switch to move said switch between said first and second positions.

5. The modular electrical distribution system of claim 4, wherein:

said housing includes a cover removable from the housing to permit access to said enclosure; and said knob is mounted to said cover to be removable with said cover.

6. The modular electrical distribution system of claim 5, wherein said switch includes a post and said knob is connected to said post in a keyed connection to permit the knob to disconnect from said post only when said switch is in said first position.

7. The modular electrical distribution system of claim 4, wherein said disconnect switch assembly includes said bus bar.

8. The modular electrical distribution system of claim 1, further comprising a plurality of auxiliary terminals fixed within said housing electrically separate from said input terminal and said bus bar terminal, one of said auxiliary terminals connectable to the negative terminal of the RV battery and others of said plurality of auxiliary terminals electrically connectable to ground wires of the RV.

9. The modular electrical distribution system of claim 1, wherein said trailer connection assembly includes an indicator panel adjacent said trailer bar, said indicator panel including color-coded indicia associated with each of said plurality of terminals, wherein the colors of the indicia correspond to the color of the wires connected to electrical components of the towing vehicle.

10. The modular electrical distribution system of claim 9, wherein said plurality of terminals include terminals for connection to brake lights, right and left turn signals, tail lights and back-up lights of the RV.

11. The modular electrical distribution system of claim 1, wherein said housing includes a number of drain holes to drain liquid from said enclosure.

12. The modular electrical distribution system of claim 11, wherein:

said housing includes side walls and a bottom wall defining said enclosure and a cover removably mounted on a perimeter of said side walls to permit access to said enclosure;

said number of drain holes are located adjacent said perimeter of said side walls; and said cover includes a lip overlapping said drain holes.

13. The modular electrical distribution system of claim 1, wherein said mounting feature includes mounting flanges extending from said housing and configured to be fastened to the primary vehicle.

14. The modular electrical distribution system of claim 2, wherein said breaker assembly includes:

an auxiliary bus bar electrically connected to said input terminal independent of said bus bar terminal; and a circuit breaker or fuse mountable at a corresponding one of said plurality of mounting locations, the circuit breaker or fuse having a first terminal connected to said auxiliary bus bar and a second terminal electrically connected to a corresponding one of said one or more output bars.

\* \* \* \* \*